(12) United States Patent
Lee

(10) Patent No.: US 9,455,310 B2
(45) Date of Patent: Sep. 27, 2016

(54) ORGANIC LIGHT EMITTING DISPLAY DEVICE

(71) Applicant: Samsung Display Co., Ltd., Yongin (KR)

(72) Inventor: Seung-Min Lee, Jeju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/734,405

(22) Filed: Jun. 9, 2015

(65) Prior Publication Data

US 2016/0079332 A1 Mar. 17, 2016

(30) Foreign Application Priority Data

Sep. 16, 2014 (KR) .......................... 10-2014-0122790

(51) Int. Cl.
*H01L 27/32* (2006.01)
*H01L 51/52* (2006.01)

(52) U.S. Cl.
CPC ......... *H01L 27/3276* (2013.01); *H01L 27/326* (2013.01); *H01L 51/5275* (2013.01); *H01L 51/5281* (2013.01)

(58) Field of Classification Search
CPC ... H01L 27/32; H01L 51/52; H01L 27/3276; H01L 27/326; H01L 51/5275; H01L 51/5268
See application file for complete search history.

(56) References Cited

U.S. PATENT DOCUMENTS

| 2006/0290852 | A1 | 12/2006 | Yum | |
|---|---|---|---|---|
| 2010/0060149 | A1* | 3/2010 | Song | H05B 33/26 313/504 |
| 2013/0037828 | A1* | 2/2013 | Moon | H01L 51/5268 257/88 |
| 2014/0008618 | A1* | 1/2014 | Lim | H01L 51/5268 257/40 |
| 2014/0138642 | A1* | 5/2014 | Kim | H01L 27/3244 257/40 |
| 2014/0198278 | A1* | 7/2014 | Kesho | G02F 1/134336 349/46 |

FOREIGN PATENT DOCUMENTS

| JP | 2013-84477 | 5/2013 |
|---|---|---|
| KR | 10-2006-0134538 | 12/2006 |
| KR | 10-2012-0133085 | 12/2012 |
| KR | 10-2013-0124488 | 11/2013 |
| KR | 10-2013-0131693 | 12/2013 |

* cited by examiner

*Primary Examiner* — Phuc Dang
(74) *Attorney, Agent, or Firm* — H.C. Park & Associates, PLC

(57) ABSTRACT

An organic light emitting display device includes a first substrate, a plurality of common lines, an optical member, and a second substrate. The first substrate includes a pixel region and a transparent region. The light emitting structure is disposed on the first substrate of the pixel region. The common lines are disposed adjacent to a boundary of the pixel region and the transparent region. The optical member prevents a light diffraction generated adjacent to the common lines. The second substrate is disposed on the light emitting structure and the optical member.

20 Claims, 8 Drawing Sheets

ORGANIC LIGHT EMITTING DISPLAY DEVICE

CROSS REFERENCE TO RELATED APPLICATION

This application claims priority from and the benefit of Korean Patent Application No. 10-2014-0122790, filed on Sep. 16, 2014, the disclosure of which is hereby incorporated by reference for all purposes as if fully set forth herein.

BACKGROUND

1. Field

Exemplary embodiments of the present invention relate to organic light emitting display devices. More particularly, exemplary embodiments of the present invention relate to organic light emitting display devices including an optical member.

2. Discussion of the Background

A flat panel display (FPD) device is widely used as a display device in various electronic devices because the FPD device is lightweight and thin compared to a traditional cathode-ray tube (CRT) display device. Typical examples of the FPD device include a liquid crystal display (LCD) device and an organic light emitting display (OLED) device. Compared to the LCD device, the OLED device has many advantages such as a higher luminance and a wider viewing angle. In addition, the OLED device can be made thinner than the LCD device, because a backlight may not be used in the OLED device. In the OLED device, electrons and holes are injected into an organic thin layer through a cathode and an anode, and then recombined in the organic thin layer to generate excitons. In this manner, a light of a specific wavelength may be emitted.

Recently, a transparent OLED device has been developed with the capability of transmitting an image of an object (or target) that is located in the rear (or at the back) of the OLED device by including a transparent region and a display region. In transparent OLED devices, a light incident into the transparent region may be diffracted by common lines that substantially surround the transparent region. For example, the common lines may include opaque materials, and, thus, the light may not transmit through the common lines. Thus, the light passing through the transparent region between adjacent common lines may be diffracted. As a result, definition of an image of an object that is located in the rear of a conventional transparent OLED device may be decreased due to the diffraction phenomenon.

SUMMARY

Exemplary embodiments of the present invention provide an organic light emitting display device including an optical member in a transparent region.

Additional features of the invention will be set forth in the description which follows, and in part will be apparent from the description, or may be learned by practice of the invention.

An exemplary embodiment of the present invention discloses an organic light emitting display device including a first substrate, a plurality of common lines, an optical member, and a second substrate. The first substrate includes a pixel region and a transparent region. The light emitting structure is disposed on the first substrate of the pixel region. The common lines are disposed adjacent to a boundary of the pixel region and the transparent region. The optical member prevents a light diffraction generated adjacent to the common lines. The second substrate is disposed on the light emitting structure and the optical member.

Thus, according to exemplary embodiments of the present invention, the organic light emitting display device with the optical member in the transparent region may increase definition of an image of an object transmitted through the transparent region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF ILLUSTRATED EMBODIMENTS

Figure 1:
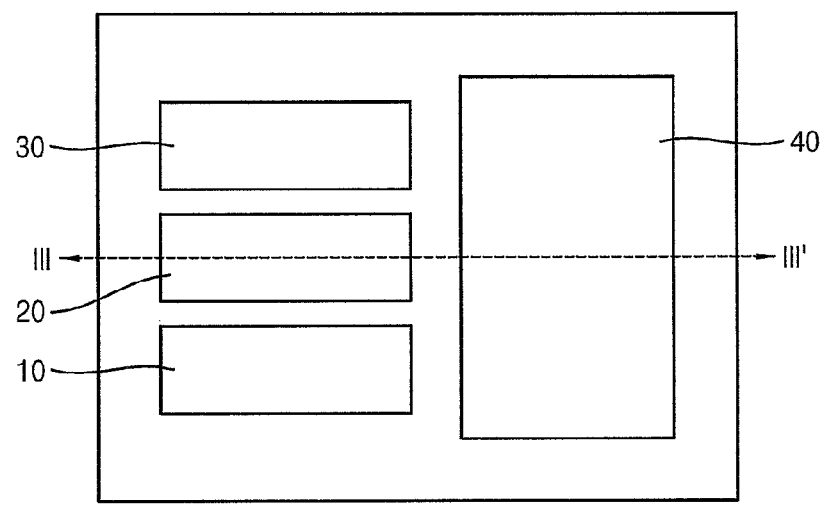
FIG. 1 is a plan view illustrating an organic light emitting display device in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a plan view illustrating an organic light emitting display device in accordance with exemplary embodiments of the present invention.

Referring to FIG. 1, an organic light emitting display device may include a pixel region and a transparent region. A plurality of pixels 10, 20, and 30 may be positioned in the pixel region, and a transparent window 40 may be positioned in the transparent region. Although the exemplary embodiments are not limited, the pixel 10 may be a pixel emitting a red color, the pixel 20 may be a pixel emitting a green color, and the pixel 30 may be a pixel emitting a blue color. The transparent window 40 may transmit external light. Here, common lines (e.g., data lines, scan lines, power supply lines, etc.) and insulating layers (a pixel defining layer, a protection layer, etc.) may be disposed in a portion (e.g., a dead space) that surrounds the pixels 10, 20, and 30 and the transparent window 40.

Figure 2:
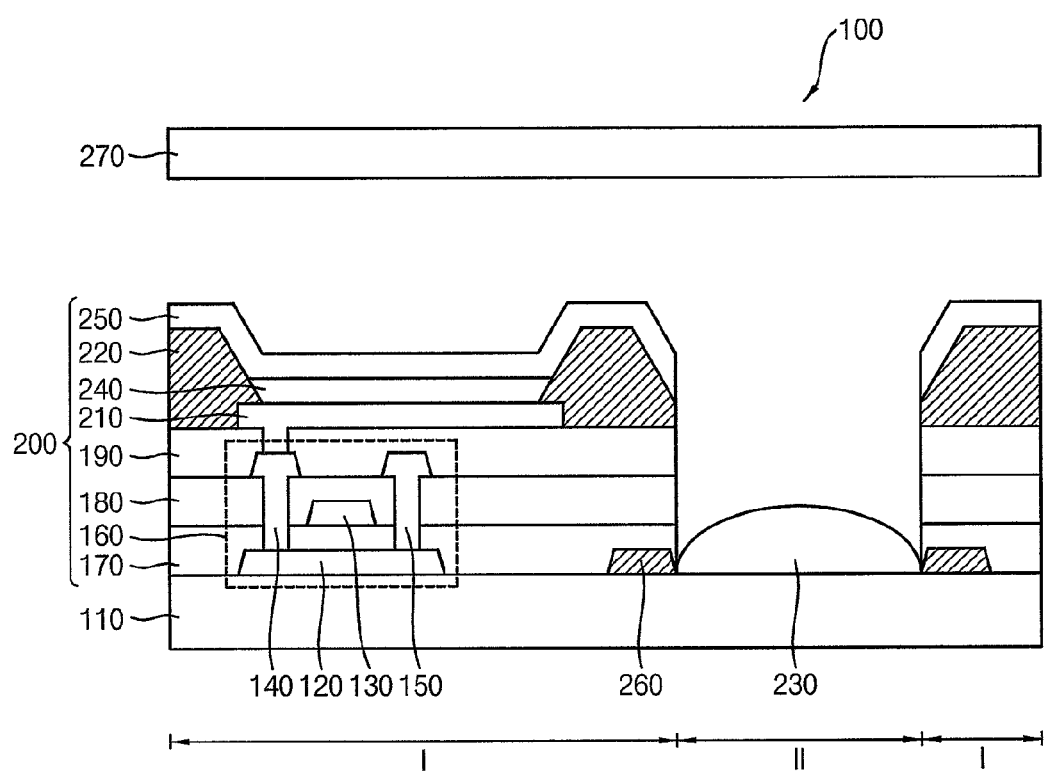
FIG. 2 is a cross-sectional view illustrating the organic light emitting display device of FIG. 1 taken along a line III-III'.

FIG. 2 is a cross-sectional view the organic light emitting display device taken along a line III-III' of FIG. 1.

Referring to FIG. 2, an organic light emitting display (OLED) device 100 may include a first substrate 110, a light emitting structure 200, an optical member 230, a plurality of common lines 260, a second substrate 270, etc. In exemplary embodiments, the OLED device 100 may include a pixel region I and a transparent region II. The light emitting structure 200 may be positioned in the pixel region I. The optical member 230 may be positioned in the transparent region II. For example, a display image may be displayed in the pixel region I. An image of an object that is located in the rear of the OLED device 100 may be transmitted through the transparent region II. Accordingly, the OLED device 100 may serve as a transparent display device including the transparent region II.

The first substrate 110 may include transparent materials. For example, the first substrate 110 may include a glass substrate, a quartz substrate, a synthetic quartz substrate, a calcium fluoride ($CaF_2$) substrate, a fluoride-doped quartz substrate, a sodalime substrate, a non-alkali substrate, etc. Since the OLED device 100 includes the pixel region I and the transparent region II, the first substrate 110 may also include a corresponding pixel region I and transparent region II. The transparent region II may be a transparent window.

The light emitting structure 200 may be disposed in the pixel region I of the first substrate 110. Here, the light emitting structure 200 may include a driving transistor 160, a first insulating layer 170, a gate insulating layer 180, a second insulating layer 190, a first electrode 210, a pixel defining layer 220, a light emitting layer 240, a second electrode 250, etc.

The driving transistor 160 may include an active layer 120, a gate electrode 130, a source electrode 140, and a drain electrode 150. The active layer 120 may be disposed on the first substrate 110. The active layer 120 may include an oxide semiconductor, an inorganic semiconductor (amorphous silicon, polysilicon, etc.), an organic semiconductor, etc. The first insulating layer 170 may be disposed on the active layer 120. The first insulating layer 170 may cover the active layer 120, and may extend into the pixel region I. That is, the first insulating layer 170 may be entirely disposed in the pixel region I of the first substrate 110, and may not be disposed in the transparent region II of the first substrate 110. The first insulating layer 170 may include a silicon compound, a metal oxide, etc. The gate electrode 130 may be disposed on the first insulating layer 170 under which the active layer 120 is positioned. The gate electrode 130 may include metal, alloy, metal nitride, conductive metal oxide, transparent conductive materials, etc. The gate insulating layer 180 may be disposed on the gate electrode 130. The gate insulating layer 180 may cover the gate electrode 130, and may extend into the pixel region I. That is, the gate insulating layer 180 may be entirely disposed in the pixel region I of the first substrate 110, and may not be disposed in the transparent region II of the first substrate 110. The gate insulating layer 180 may include a silicon compound, a metal oxide, etc. The source electrode 140 and the drain electrode 150 may be disposed on the gate insulating layer 180. The source electrode 140 may be disposed in a first side of the active layer 120 by removing a first portion of the first and gate insulating layers 170 and 180. The drain electrode 150 may be disposed in a second side of the active layer 120 by removing a second portion of the first and gate insulating layers 170 and 180. Each of the source electrode 140 and the drain electrode 150 may include metal, alloy, metal nitride, conductive metal oxide, transparent conductive materials, etc. These may be used alone or in a combination thereof. The second insulating layer 190 may be disposed on the source electrode 140 and the drain electrode 150. The second insulating layer 190 may cover the source electrode 140 and the drain electrode 150, and may extend into the pixel region I. That is, the second insulating layer 190 may be entirely disposed in the pixel region I of the first substrate 110, and may not be disposed in the transparent region II of the first substrate 110. The second insulating layer 190 may include a silicon compound, a metal oxide, etc. The first electrode 210 may be disposed on the second insulating layer 190. The first electrode 210 may contact the source electrode 140 by removing a portion of the second insulating layer 190. The first electrode 210 may include metal, alloy, metal nitride, conductive metal oxide, transparent conductive materials, etc. The pixel defining layer 220 may be disposed on a portion of the second insulating layer 190 and a portion of the first electrode 210. The pixel defining layer 220 may cover both side portions of the first electrode 210, and may expose a portion of the first electrode 210. The pixel defining layer 220 may include organic materials and/or inorganic materials. The light emitting layer 240 may be disposed on the first electrode 210. The light emitting layer 240 may be formed using light emitting materials capable of generating different colors of light (e.g., a red color of light, a blue color of light, and a green color of light). Alternatively, the light emitting layer 240 may generate a white color of light by stacking a plurality of light emitting materials, each light emitting material capable of generating a different color of light. The second electrode 250 may be disposed on the pixel defining layer 220 and the light emitting layer 240. The second electrode 250 may cover the pixel defining layer 220 and the light emitting layer 240, and may extend into the pixel region I. That is, the second electrode 250 may be entirely disposed in the pixel region I of the first substrate 110, and may not be disposed in the transparent region II of the first substrate 110.

The common lines 260 may be disposed on the first substrate 110. The common lines 260 may be disposed adjacent to a boundary of the pixel region I and the transparent region II. For example, the common lines 260 may be disposed in an outermost portion of the pixel region I. The common lines 260 may be disposed substantially surrounding the transparent region II, as shown in FIG. 2. A region in which the common lines 260 are positioned may be a dead space or a peripheral region. As described above, the common lines 260 may include data lines, scan lines, power supply lines, and/or the like. In exemplary embodiments, the common lines 260 may include opaque materials. Thus, an external light may not transmit through the common lines 260. Here, the external light may be a light incident from the outside into the transparent region II of the first substrate 110. For example, the common lines 260 may include aluminum alloy, aluminum nitride (AlNx), silver alloy, tungsten nitride (WNx), copper alloy, chrome nitride (CrNx), molybdenum alloy, titanium nitride (TiNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. Since the common lines 260 include opaque materials and are disposed substantially surrounding the transparent region II, the adjacent common lines 260 and the transparent region II may substantially have a shape of a slit.

In particular, when a light passes through a double slit, a diffraction phenomenon may occur. For example, as the light that is a plane wave passes through the double slit, the light is changed from the plane wave into a spherical wave. The spherical waves may generate the diffraction phenomenon. Thus, as a constructive interference and a destructive interference are generated in the spherical waves, intensity of the light passing through the double slit may be irregular. A plurality of transparent regions may be positioned in the OLED device 100. In addition, a plurality of common lines 260 substantially surrounding the transparent regions may be positioned in the OLED device 100. In this case, the transparent regions and the common lines may be the double slit, and the external light transmitting through the transparent regions may be the light. Accordingly, intensity of the external light may be irregular. Thus, definition of an image of an object that located in the rear of the OLED device 100 may be decreased. Alternatively, the common lines 260 and the gate electrode 130 may be disposed at a same level. In this case, the common lines 260 and the gate electrode 130 may include the same materials.

The optical member 230 may be positioned in the transparent region II of the first substrate 110. The optical member 230 may be disposed between the adjacent common lines 260 positioned in the pixel region I of the first substrate 110. The optical member 230 may have a rounded upper surface and a planar lower surface. An upper surface of the optical member 230 may include a cross sectional shape of a substantially half circular shape, a substantially half elliptical shape, etc. The lower surface of the optical member 230 may contact the first substrate 110. In exemplary embodiments, the optical member 230 may include a half convex lens. As described above, as the external light is diffracted by the adjacent common lines 260, the optical member 230 may be interposed between the adjacent common lines 260 to prevent the diffraction phenomenon of the external light. The optical member 230 may change a travel direction of the external light that is diffracted by the adjacent common lines 260. The travel direction of the external light rays may be changed as a direction that is substantially perpendicular to an upper surface of the first substrate 110. For example, the travel direction of the external light rays may be parallel to each other in the direction that is substantially perpendicular to the upper surface of the first substrate 110. In this case, a curvature of the upper surface of the optical member 230 may be controlled in accordance with a distance between the adjacent common lines 260. The transparent region II is interposed between the adjacent common lines 260 such that the travel direction of external light rays are parallel to each other in the direction that is substantially perpendicular to the upper surface of the first substrate 110. Accordingly, intensity of the external light may have a uniform intensity of light. Thus, definition of an image of an object that located in the rear of the OLED device 100 may be increased.

The optical member 230 may include transparent organic materials. For example, the optical member 230 may include polyimide, photoresist, acryl, polyamide, siloxane, etc. Alternatively, the optical member 230 may include transparent inorganic materials. For example, the optical member 230 may include silicon oxide (SiOx), silicon nitride (SiNx), silicon oxynitride (SiOxNy), Aluminum oxide (AlOx), aluminum nitride (AlNx), titanium oxide (TiOx), zinc oxide (ZnOx), etc. In exemplary embodiments, when the first substrate 110, the optical member 230, and the second substrate 270 have the same materials, the first substrate 110, the optical member 230, and the second substrate 270 may have substantially the same refractive index. In this case, the external light may not be refracted in an interface between the first substrate 110 and the optical member 230. The external light passing through the optical member 230 may transmit the second substrate 270 without refraction of the light. Accordingly, transmissivity of the OLED device 100 may be increased, and definition of the OLED device 100 may be improved.

The second substrate 270 may be disposed on the light emitting structure 200 and the optical member 230. The second substrate 270 may include materials substantially the same as those of the first substrate 110. For example, the second substrate 270 may include a glass substrate, a quartz substrate, a synthetic quartz substrate, a calcium fluoride (CaF$_2$) substrate, a fluoride-doped quartz substrate, a sodalime substrate, non-alkali substrate, etc.

The OLED device 100 according to exemplary embodiments may include the optical member 230 between the adjacent common lines 260. Accordingly, since the external light is not diffracted in the transparent region II, the OLED device 100 may serve as a transparent display device having a uniform intensity of external light. When the first substrate 110, the optical member 230, and the second substrate 270 include the same materials, interlayer interfaces capable of reflecting or refracting the external light may be reduced. Thus, transmissivity of the OLED device 100 may further be increased and definition of an image of an object that is located in the rear of the OLED device 100 may further be increased.

FIGS. 3A through 3F are cross-sectional views illustrating a method of manufacturing an organic light emitting display device in accordance with exemplary embodiments of the present invention.

Figure 3A:
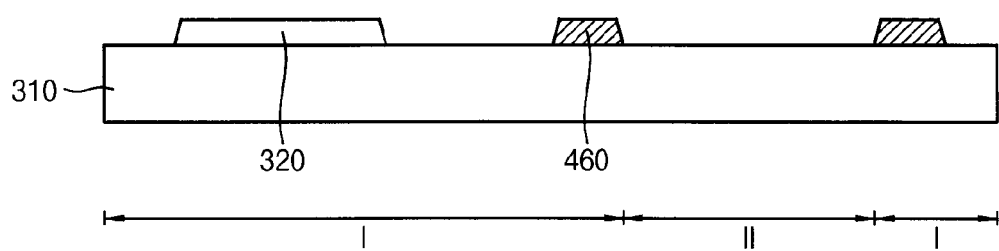
FIGS. 3A through 3F are cross-sectional views illustrating a method of manufacturing an organic light emitting display device in accordance with an exemplary embodiment of the present invention.

Referring to FIG. 3A, an active layer 320 and a plurality of common lines 460 may be formed in a pixel region I of a first substrate 310. The common lines 460 may be formed adjacent to a boundary of the pixel region I and the transparent region II. For example, the common lines 460 may be formed substantially surrounding the transparent region II. A region in which the common lines 460 are formed may be a dead space or a peripheral region. Further, the common lines 460 may include data lines, scan lines, power supply lines, or the like. The common lines 460 may include opaque materials. In this case, external light may not transmit through the common lines 460. In exemplary embodiments, the active layer 320 and the common lines 460 may be simultaneously formed. For example, after the active layer 320 and the common lines 460 are formed using the same materials, a doping process may be performed in a portion in which the common lines 460 are positioned. After the doping process, the common lines 460 may be formed as a conductive metal.

Additionally or alternatively, the common lines 460 and a gate electrode 330 positioned on the active layer 320 (refer to FIG. 3C) may be simultaneously formed. In this case, the common lines 460 and the gate electrode 330 may include the same materials. For example, the common lines 460 and the gate electrode 330 may include aluminum alloy, AlNx, silver alloy, WNx, copper alloy, CrNx, molybdenum alloy, TiNx, TaNx, SRO, ZnOx, ITO, SnOx, InOx, GaOx, IZO, etc. The first substrate 310 may include transparent materials. For example, the first substrate 310 may include a glass substrate, a quartz substrate, a synthetic quartz substrate, a calcium fluoride (CaF$_2$) substrate, a fluoride-doped quartz substrate, a sodalime substrate, non-alkali substrate, etc. The active layer 320 may include an oxide semiconductor, an inorganic semiconductor, an organic semiconductor, etc.

Figure 3B:
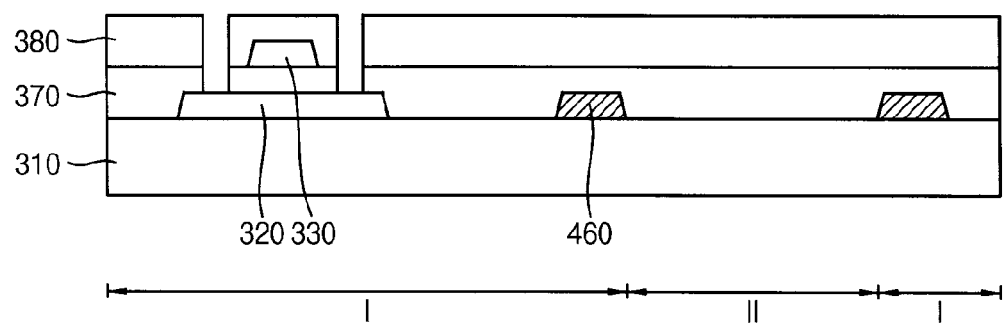

Referring to FIG. 3B, a first insulating layer 370 may be formed on the first substrate 310. The first insulating layer 370 may cover the active layer 320 and the common lines 460, and may extend from the pixel region I into a transparent region II. For example, the first insulating layer 370 may be formed using a silicon compound, a metal oxide, etc.

A gate electrode 330 may be formed on the first insulating layer 370, under which the active layer 320 is positioned. In exemplary embodiments, the gate electrode 330 may include metal, alloy, metal nitride, conductive metal oxide, transparent conductive materials, etc.

A gate insulating layer 380 may be formed on the first insulating layer 370. The gate insulating layer 380 may cover the gate electrode 330, and may extend from the pixel region I into the transparent region II. After the gate insulating layer 380 is formed on the first insulating layer 370, a first contact hole that is positioned in a first side of the active layer 320 may be formed by removing a first portion of the first insulating layer 370 and the gate insulating layer 380. A second contact hole that is positioned in a second side of the active layer 320 may be formed by removing a second portion of the first insulating layer 370 and the gate insulating layer 380. For example, the gate insulating layer 380 may be formed using a silicon compound, a metal oxide, etc.

Figure 3C:
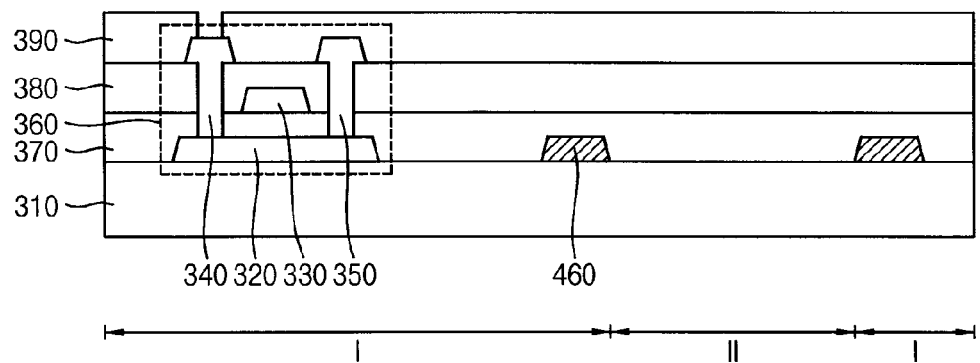

Referring to FIG. 3C, a source electrode 340 may fill the first contact hole. After the source electrode 340 is disposed into the first contact hole, the source electrode 340 may be formed such that the source electrode 340 contacts the first side of the active layer 320. A drain electrode 350 may fill the second contact hole. After the drain electrode 350 is disposed into the second contact hole, the drain electrode 350 may be formed such that the drain electrode 350 contacts the second side of the active layer 320. For example, each of the source electrode 340 and the drain electrode 350 may be formed using metal, alloy, metal nitride, conductive metal oxide, transparent conductive materials, etc. These may be used alone or in a combination thereof. In this manner, a driving transistor 360 including the source electrode 340, the drain electrode 350, the gate electrode 330, and the active layer 320 may be formed.

A second insulating layer 390 may be formed on the source electrode 340 and the drain electrode 350. The second insulating layer 390 may cover the source electrode 340 and the drain electrode 350, and may extend from the pixel region I into the transparent region II. The second insulating layer 390 may be formed using a silicon compound, a metal oxide, etc. After the second insulating layer 390 is formed on the gate insulating layer 380, a third contact hole exposing a portion of the source electrode 340 may be formed by removing a portion of the second insulating layer 390.

Figure 3D:
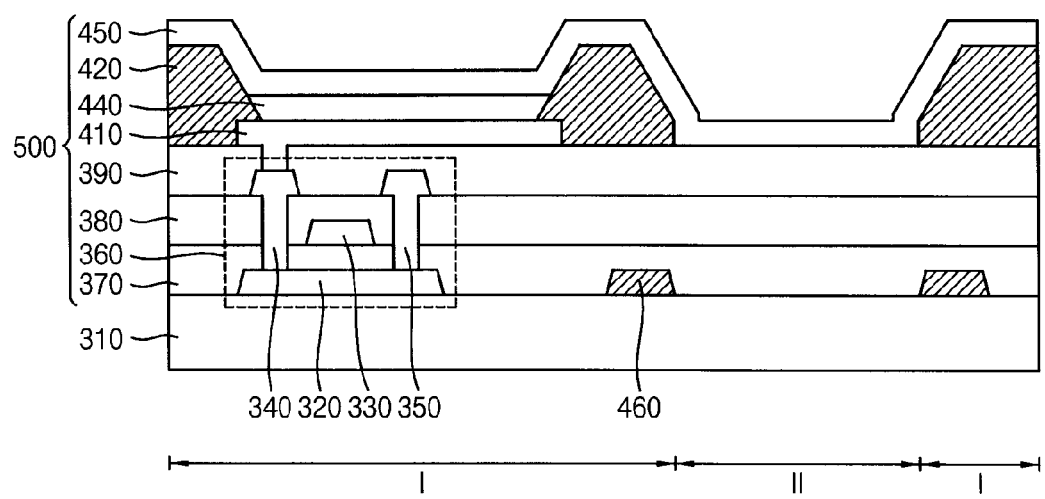

Referring to FIG. 3D, a first electrode 410 may be formed on the second insulating layer 390. The first electrode 410 may contact the source electrode 340 via the third contact hole. The first electrode 410 may be formed using metal, alloy, metal nitride, conductive metal oxide, transparent conductive materials, etc.

A pixel defining layer 420 may be formed on a portion of the second insulating layer 390 and a portion of the first electrode 410. The pixel defining layer 420 may cover both side portions of the first electrode 410, and may expose a portion of the first electrode 410. The pixel defining layer 420 may be formed using organic materials or inorganic materials.

A light emitting layer 440 may be formed on the first electrode 410. The light emitting layer 440 may be formed using light emitting materials capable of generating different colors of light (e.g., a red color of light, a blue color of light, and a green color of light). Alternatively, the emission layer 440 may generally generate a white color of light by stacking a plurality of light emitting materials, each light emitting material being capable of generating a different color of light such as a red color of light, a green color of light, a blue color of light, etc.

A second electrode 450 may be formed on the pixel defining layer 420, the light emitting layer 440, and the second insulating layer 390. The second electrode 450 may cover the pixel defining layer 420, the light emitting layer 440, and the second insulating layer 390, and may be entirely formed in the pixel region I and the transparent region II. For example, the second electrode 450 may be formed using metal, alloy, metal nitride, conductive metal oxide, transparent conductive materials, etc. Thus, a light emitting structure 500 including the first insulating layer 370, the driving transistor 360, the gate insulating layer 380, the second insulating layer 390, the first electrode 410, the pixel defining layer 420, the light emitting layer 440, and the second electrode 450, may be formed.

Figure 3E:
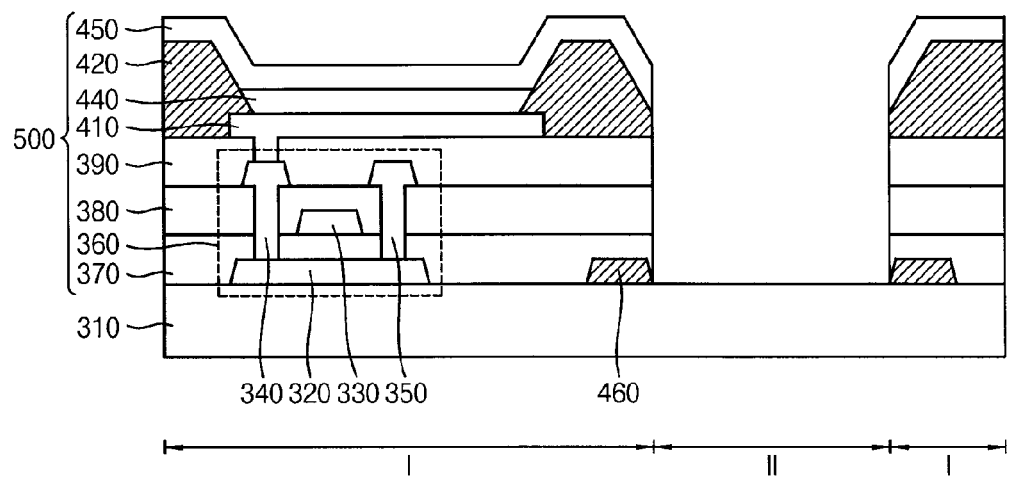

Referring to FIG. 3E, the first insulating layer 370, the gate insulating layer 380, the second insulating layer 390, and the second electrode 450 positioned in the transparent region II of the first substrate 310 may be removed. Here, the common lines 460 may be positioned adjacent to an outside of the transparent region II (e.g., an outermost portion of the pixel region I), and may not be removed.

Figure 3F:
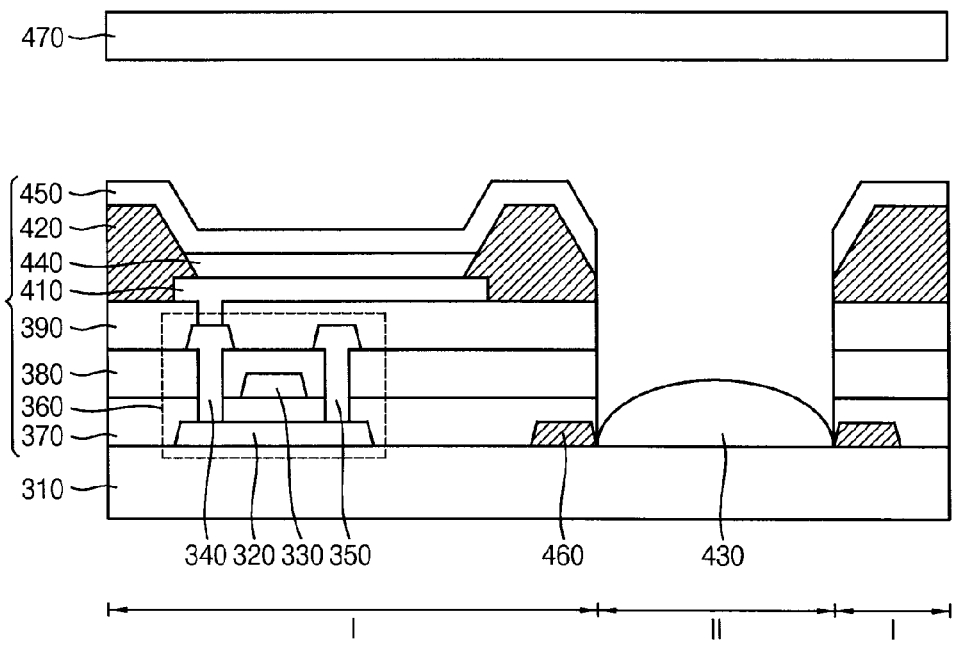

Referring to FIG. 3F, the optical member 430 may be formed in the transparent region II of the first substrate 310. The optical member 430 may be formed between the adjacent common lines 460 positioned in the pixel region I of the first substrate 310. The optical member 430 may have a rounded upper surface and a planar lower surface. The optical member 430 may include a cross sectional shape of a substantially half circular shape, a substantially half elliptical shape, etc. In exemplary embodiments, the optical member 230 may be formed as a shape of a half convex lens. Since the external light is diffracted by the adjacent common lines 460, the optical member 430 may be formed between the adjacent common lines 460 to prevent a diffraction phenomenon of the external light. A curvature of the upper surface of the optical member 430 may be controlled in accordance with a distance between the adjacent common lines 460 such that the travel directions of the external light rays are parallel to each other.

The second substrate 470 may be formed on the light emitting structure 500 and the optical member 430. The second substrate 470 may include materials substantially the same as that of the first substrate 310. For example, the second substrate 470 may include a glass substrate, a quartz substrate, a synthetic quartz substrate, a calcium fluoride (CaF$_2$) substrate, a fluoride-doped quartz substrate, a sodalime substrate, non-alkali substrate, etc.

Figure 4:
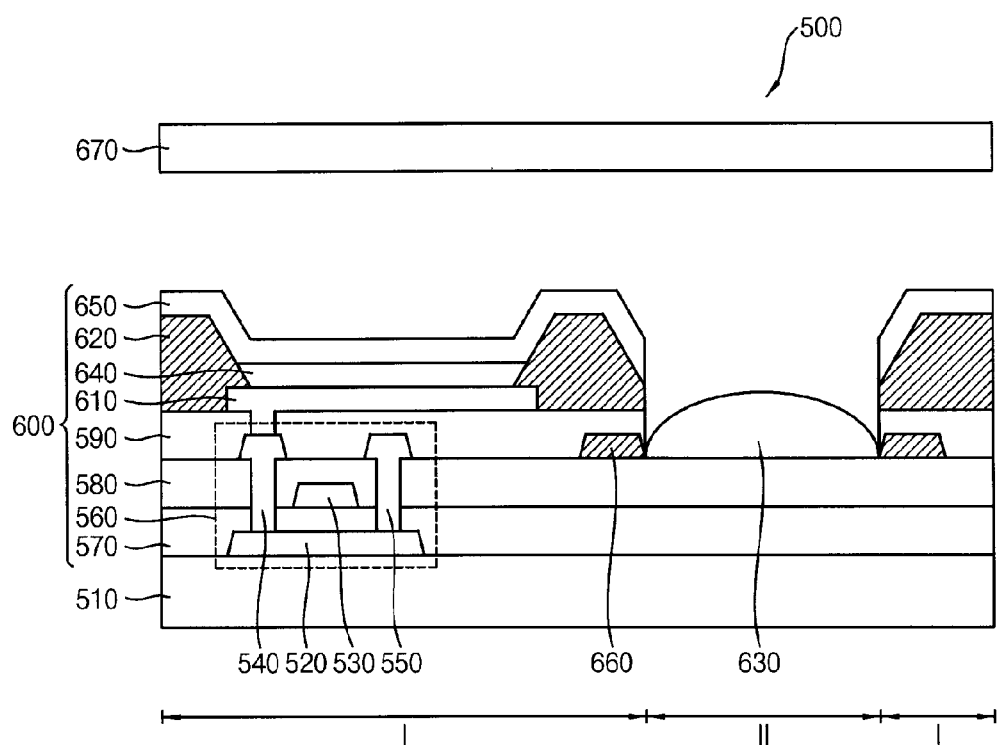
FIG. 4 is a cross-sectional view illustrating an organic light emitting display device in accordance with an exemplary embodiment of the present invention.

FIG. 4 is a cross-sectional view illustrating an organic light emitting display device in accordance with exemplary embodiments of the present invention. An organic light emitting display device 500 illustrated in FIG. 4 may have a configuration substantially the same as or similar to that of an organic light emitting display device 100 described with reference to FIG. 2, except insulating layers disposed in a transparent region II. In FIG. 4, detailed descriptions for elements, which are substantially the same as or similar to the elements described with reference to FIG. 2, will be omitted.

Referring to FIG. 4, an organic light emitting display (OLED) device 500 may include a first substrate 510, a light emitting structure 600, an optical member 630, a plurality of common lines 660, a second substrate 670, etc. Here, the light emitting structure 600 may include a driving transistor 560, a first insulating layer 570, a gate insulating layer 580, a second insulating layer 590, a first electrode 610, a pixel defining layer 620, a light emitting layer 640, a second electrode 650, etc. In addition, the driving transistor 560 may include an active layer 520, a gate electrode 530, a source electrode 540, and a drain electrode 550. In exemplary embodiments, the OLED device 500 may include a pixel region I and a transparent region II. The light emitting structure 600 and the common lines 660 may be positioned in the pixel region I. In addition, the optical member 630 may be positioned in the transparent region II. For example, a display image may be displayed in the pixel region I. An image of an object that is located in the rear of the OLED device 500 may be transmitted through the transparent region II. Accordingly, the OLED device 500 may serve as a transparent display device including the transparent region II.

The first insulating layer 570 may be disposed on the active layer 520. The first insulating layer 570 may cover the active layer 520, and may extend from pixel region I into the transparent region II. That is, the first insulating layer 570 may be entirely disposed in the pixel region I and the transparent region II of the first substrate 510. The gate insulating layer 580 may be disposed on the first insulating layer 570. The gate insulating layer 580 may cover the gate electrode 530, and may extend from pixel region I into the transparent region II. That is, the gate insulating layer 580 may be entirely disposed in the pixel region I and the transparent region II of the first substrate 510. The second insulating layer 590 may be disposed on the gate insulating layer 580. The second insulating layer 590 may cover the source electrode 540, the drain electrode 550, and the common lines 660, and may extend into the pixel region I. That is, the second insulating layer 590 may not be disposed in the transparent region II of the first substrate 510. Each of the first insulating layer 570, the gate insulating layer 580, and the second insulating layer 590 may include transparent inorganic materials or transparent organic materials. For example, the inorganic materials may include SiOx, SiNx, SiOxNy, AlOx, AlNx, TiOx, ZnOx, etc. The organic materials may include acrylate monomer, phenylacetylene, diamine, dianhydride, siloxane, silane, parylene, polyethylene, polypropylene, PET, fluororesin, polysiloxane, etc. In exemplary embodiments, the first insulating layer 570, the gate insulating layer 580, the second insulating layer 590, and the common lines 660 may have substantially the same materials, and/or may have substantially the same refractive index.

The common lines 660 may be interposed between the gate insulating layer 580 and the second insulating layer 590. That is, the common lines 660, the source electrode 540, and the drain electrode 550 may be disposed in the same level. The common lines 660, the source electrode 540, and the drain electrode 550 may include the same materials. The common lines 660 may be disposed adjacent to a boundary of the pixel region I and the transparent region II. For example, the common lines 660 may be disposed in an outermost portion of the pixel region I, as shown in FIG. 4.

The common lines 660 may be disposed substantially surrounding the transparent region II. A region in which the common lines 660 are positioned may be a dead space or a peripheral region. The common lines 660 may include data lines, scan lines, power supply lines, and/or the like. In exemplary embodiments, the common lines 660 may include opaque materials. Thus, an external light may not transmit through the common lines 660. For example, the common lines 660 may include aluminum alloy, AlNx, silver alloy, WNx, copper alloy, CrNx, molybdenum alloy, TiNx, TaNx, SRO, ZnOx, ITO, SnOx, InOx, GaOx, IZO, etc. Since the common lines 660 include opaque materials and are disposed substantially surrounding the transparent region II, the adjacent common lines 660 and the transparent region II may substantially have a shape of a slit.

In particular, when a light passes through a double slit, a diffraction phenomenon may occur. That is, as the light that is a plane wave passes through the double slit, the light changes from the plane wave into a spherical wave. The spherical waves may generate the diffraction phenomenon. Thus, as a constructive interference and a destructive interference are generated in the spherical waves, intensity of the light passing through the double slit may be irregular. A plurality of transparent regions may be positioned in the OLED device 500. In addition, a plurality of common lines 660 substantially surrounding the transparent regions may be positioned in the OLED device 500. In this case, the transparent regions and the common lines may be the double slit, and the external light transmitting through the transparent regions may be the light. Accordingly, intensity of the external light may be irregular. Thus, definition of an image of an object that located in the rear of the OLED device 500 may be decreased. Alternatively, the common lines 660 and the gate electrode 530 may be disposed at the same level. In this case, the common lines 660 and the gate electrode 530 may include the same materials.

The optical member 630 may be disposed in the transparent region II of the second insulating layer 590. The optical member 630 may be disposed between the adjacent common lines 660 positioned in the pixel region I of the first substrate 510. The optical member 630 may have a rounded upper surface and a planar lower surface. An upper surface of the optical member 630 may include a cross sectional shape of a substantially half circular shape, a substantially half elliptical shape, etc. The lower surface of the optical member 630 may contact the gate insulating layer 580. In exemplary embodiments, the optical member 630 may include a half convex lens. As described above, as the external light is diffracted by the adjacent common lines 660, the optical member 630 may be interposed between the adjacent common lines 660 to prevent the diffraction phenomenon of the external light. The optical member 630 may change a travel direction of the external light that is diffracted by the adjacent common lines 660. The travel direction of the external light may be changed as a direction that is substantially perpendicular to an upper surface of the first substrate 510. For example, the travel direction of the external light rays may be parallel to each other in the direction that is substantially perpendicular to the upper surface of the first substrate 510. In this case, a curvature of the upper surface of the optical member 630 may be controlled in accordance with a distance between the adjacent common lines 660. The transparent region II is interposed between the adjacent common lines 260 such that the travel directions of external light rays are parallel to each other in the direction that is substantially perpendicular to the upper surface of the first substrate 510. Accordingly, intensity of the external light may have a uniform intensity of light. This may increase definition of an image of an object that located in the rear of the OLED device 500.

The optical member 630 may include transparent organic materials. For example, the optical member 630 may include polyimide, photoresist, acryl, polyamide, siloxane, etc. Alternatively, the optical member 630 may include transparent inorganic materials. For example, the optical member 630 may include SiOx, SiNx, SiOxNy, AlOx, AlNx, TiOx, ZnOx, etc. In some exemplary embodiments, when the first insulating layer 570, the gate insulating layer 580, and the optical member 630 have the same materials, the first insulating layer 570, the gate insulating layer 580, and the optical member 630 may have substantially the same refractive index. In this case, the external light may not be refracted in interfaces between the first insulating layer 570 and the gate insulating layer 580, and between gate insulating layer 580 and the optical member 630. Accordingly, transmissivity of the OLED device 500 may be increased, and definition of the OLED device 100 may be improved.

Figure 5:
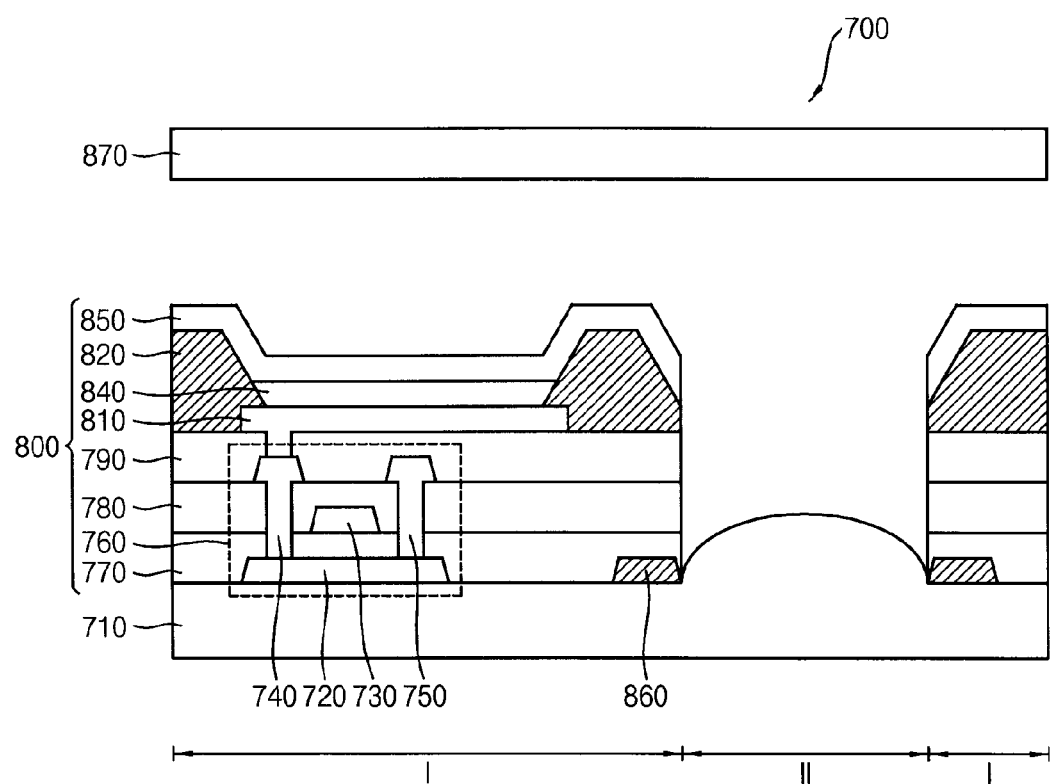
FIG. 5 is a cross-sectional view illustrating an organic light emitting display device in accordance with an exemplary embodiment of the present invention.

FIG. 5 is a cross-sectional view illustrating an organic light emitting display device in accordance with an exemplary embodiment of the present invention. An organic light emitting display device 700 illustrated in FIG. 5 may have a configuration substantially the same as or similar to that of an organic light emitting display device 100 described with reference to FIG. 2 except a shape of a first substrate 710. In FIG. 5, detailed descriptions for elements, which are substantially the same as or similar to the elements described with reference to FIG. 2, will be omitted.

Referring to FIG. 5, an organic light emitting display (OLED) device 700 may include a first substrate 710, a light emitting structure 800, a plurality of common lines 860, a second substrate 870, etc. Here, the light emitting structure 800 may include a driving transistor 760, a first insulating layer 770, a gate insulating layer 780, a second insulating layer 790, a first electrode 810, a pixel defining layer 820, a light emitting layer 840, a second electrode 850, etc.

The driving transistor 760 may include an active layer 720, a gate electrode 730, a source electrode 740, and a drain electrode 750. In exemplary embodiments, the OLED device 700 may include a pixel region I and a transparent region II. The light emitting structure 800 and the common lines 860 may be positioned in the pixel region I. In addition, a protruding portion of the first substrate 710 may be positioned in the transparent region II. For example, a display image may be displayed in the pixel region I. An image of an object that is located in the rear of the OLED device 700 may be transmitted through the transparent region II. Accordingly, the OLED device 700 may serve as a transparent display device including the transparent region II.

The first substrate 710 may include transparent materials. For example, the first substrate 710 may include a glass substrate, a quartz substrate, a synthetic quartz substrate, a calcium fluoride ($CaF_2$) substrate, a fluoride-doped quartz substrate, a sodalime substrate, non-alkali substrate etc. Since the OLED device 700 includes the pixel region I and the transparent region II, the first substrate 710 may include the pixel region I and the transparent region II. In exemplary embodiments, the first substrate 710 may include the protruding portion in the transparent region II. The protruding portion may have a rounded upper surface. The protruding portion may include a cross sectional shape of a substantially half circular shape, a substantially half elliptical shape, etc. The protruding portion may substantially have a shape of a half convex lens. Since an external light is diffracted by the adjacent common lines 860, the protruding portion may be interposed between the adjacent common lines 860 to prevent the diffraction phenomenon of the external light. The protruding portion may change a travel direction of external light rays that are diffracted by the adjacent common lines 860. The travel direction of the external light rays may be changed as a direction that is substantially perpendicular to an upper surface of the first substrate 710. For example, the travel direction of the external light rays may be parallel to each other in the direction that is substantially perpendicular to the upper surface of the first substrate 710. In this case, a curvature of the upper surface of the protruding portion may be controlled in accordance with a distance between the adjacent common lines 860. The transparent region II is interposed between the adjacent common lines 260 such that the travel direction of external light rays are parallel to each other in the direction that is substantially perpendicular to the upper surface of the first substrate 710. Accordingly, intensity of the external light may have a uniform intensity of light. Thus, definition of an image of an object that located in the rear of the OLED device 700 may be increased.

Figure 6:
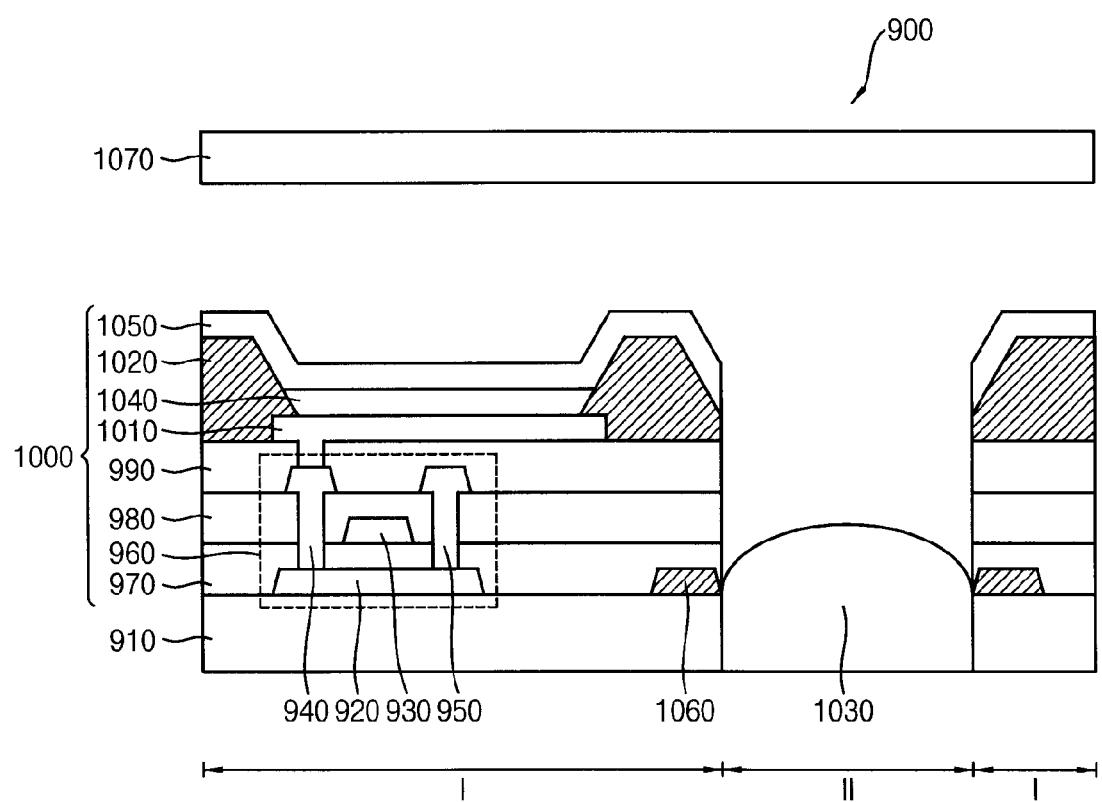
FIG. 6 is a cross-sectional view illustrating an organic light emitting display device in accordance with an exemplary embodiment of the present invention.

FIG. 6 is a cross-sectional view illustrating an organic light emitting display device in accordance with an exemplary embodiment of the present invention. An organic light emitting display device 900 illustrated in FIG. 5 may have a configuration substantially the same as or similar to that of an organic light emitting display device 100 described with reference to FIG. 2 except a transparent member 1030. In FIG. 6, detailed descriptions for elements, which are substantially the same as or similar to the elements described with reference to FIG. 2, will be omitted.

Referring to FIG. 6, an organic light emitting display (OLED) device 900 may include a first substrate 910, a light emitting structure 1000, a plurality of common lines 1060, a second substrate 1070, a transparent member 1030 etc. Here, the light emitting structure 1000 may include a driving transistor 960, a first insulating layer 970, a gate insulating layer 980, a second insulating layer 990, a first electrode 1010, a pixel defining layer 1020, a light emitting layer 1040, a second electrode 1050, etc. In addition, the driving transistor 960 may include an active layer 920, a gate electrode 930, a source electrode 940, and a drain electrode 950. In exemplary embodiments, the OLED device 900 may include a pixel region I and a transparent region II. The light emitting structure 1000 and the common lines 1060 may be positioned in the pixel region I. In addition, the transparent member 1030 may be positioned in the transparent region II. For example, a display image may be displayed in the pixel region I. An image of an object that is located in the rear of the OLED device 900 may be transmitted through the transparent region II. Accordingly, the OLED device 900 may serve as a transparent display device including the transparent region II.

Since the OLED device 900 includes the pixel region I and the transparent region II, the first substrate 910 may also include a corresponding pixel region I and transparent region II. In exemplary embodiments, an opening may be positioned in the transparent region II by removing a portion of the first substrate 910. The first substrate 910 including the opening positioned in the transparent region II may have a substantially mesh-like or grid-like structure having a plurality of openings. The first substrate 910 may include transparent materials. For example, the first substrate 910 may include a glass substrate, a quartz substrate, a synthetic quartz substrate, a calcium fluoride ($CaF_2$) substrate, a fluoride-doped quartz substrate, a sodalime substrate, a non-alkali substrate etc.

The transparent member 1030 may be disposed in the opening. In exemplary embodiments, the transparent member 1030 may include a protruding portion. The protruding portion and the adjacent common lines 1060 may be positioned in the same level. The protruding portion may have a rounded upper surface. The protruding portion may substantially have a shape of a half convex lens. Since an external light is diffracted by the adjacent common lines 1060, the protruding portion may be interposed between the adjacent common lines 1060 to prevent the diffraction phenomenon of the external light. The protruding portion may change a travel direction of the external light that is diffracted by the adjacent common lines 1060.

The travel direction of the external light rays may be changed as a direction that is substantially perpendicular to an upper surface of the first substrate 910. For example, the travel direction of the external light rays may be parallel to each other in the direction that is substantially perpendicular to the upper surface of the first substrate 910. In this case, a curvature of the upper surface of the protruding portion may be controlled in accordance with a distance between the adjacent common lines 1060. The transparent region II is interposed between the adjacent common lines 260 such that the travel direction of external light rays are parallel to each other in the direction that is substantially perpendicular to the upper surface of the first substrate 910. Accordingly, intensity of the external light may have a uniform intensity of light. Thus, definition of an image of an object that located in the rear of the OLED device 900 may be increased.

Figure 7:
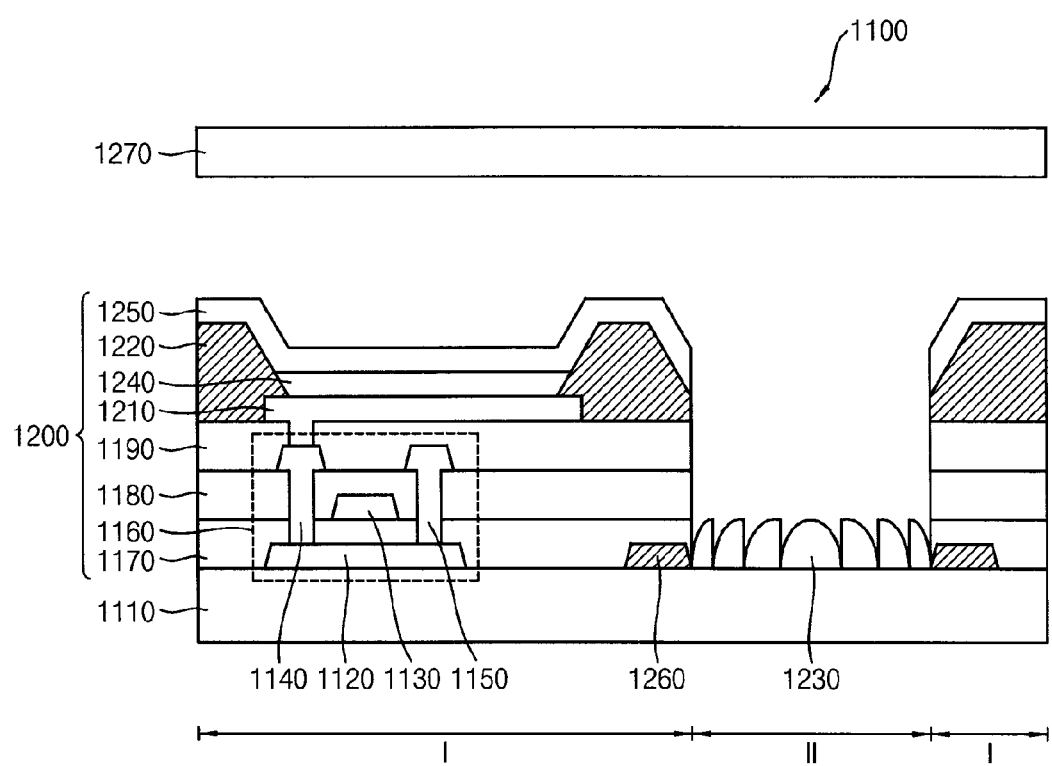
FIG. 7 is a cross-sectional view illustrating an organic light emitting display device in accordance with an exemplary embodiment of the present invention.

FIG. 7 is a cross-sectional view illustrating an organic light emitting display device in accordance with an exemplary embodiment of the present invention. An organic light emitting display device 1100 illustrated in FIG. 7 may have a configuration substantially the same as or similar to that of an organic light emitting display device 100 described with reference to FIG. 2 except a Fresnel lens 1230. In FIG. 7, detailed descriptions for elements, which are substantially the same as or similar to the elements described with reference to FIG. 2, will be omitted.

Referring to FIG. 7, an organic light emitting display (OLED) device 1100 may include a first substrate 1110, a light emitting structure 1200, a plurality of common lines 1260, a second substrate 1270, a Fresnel lens 1230 etc. Here, the light emitting structure 1200 may include a driving transistor 1160, a first insulating layer 1170, a gate insulating layer 1180, a second insulating layer 1190, a first electrode 1210, a pixel defining layer 1220, a light emitting layer 1240, a second electrode 1250, etc.

The driving transistor 1160 may include an active layer 1120, a gate electrode 1130, a source electrode 1140, and a drain electrode 1150. In exemplary embodiments, the OLED device 1100 may include a pixel region I and a transparent region II. The light emitting structure 1200 and the common lines 1260 may be positioned in the pixel region I. The Fresnel lens 1230 may be positioned in the transparent region II. For example, a display image may be displayed in the pixel region I. An image of an object that is located in the rear of the OLED device 1100 may be transmitted through the transparent region II. Accordingly, the OLED device 1100 may serve as a transparent display device including the transparent region II.

Since the OLED device 1100 includes the pixel region I and the transparent region II, the first substrate 1110 may also include a corresponding pixel region I and transparent region II. The first substrate 1110 may include transparent materials. The first substrate 1110 may include a glass substrate, a quartz substrate, a synthetic quartz substrate, a calcium fluoride ($CaF_2$) substrate, a fluoride-doped quartz substrate, a sodalime substrate, non-alkali substrate, etc.

The Fresnel lens 1230 may be disposed in the transparent region II of the first substrate 1110. In exemplary embodiments, the Fresnel lens 1230 and the adjacent common lines 1260 may be disposed in the same level. Since an external light is diffracted by the adjacent common lines 1260, the Fresnel lens 1230 may be interposed between the adjacent common lines 1260 to prevent the diffraction phenomenon of the external light. The Fresnel lens 1230 may change a travel direction of external light rays that are diffracted by the adjacent common lines 1260. The travel direction of the external light rays may be changed as a direction that is substantially perpendicular to an upper surface of the first substrate 1110. For example, the travel direction of the external light may be arranged in parallel to each other in the direction that is substantially perpendicular to the upper surface of the first substrate 1110. Accordingly, intensity of the external light passing through the transparent region II may have a uniform intensity of light. Thus, definition of an image of an object that located in the rear of the OLED device 1100 may be increased.

The exemplary embodiments of the invention may be applied to various display devices including an organic light emitting display device. For example, the exemplary embodiments of the invention may be employed in a vehicle-display device, a ship-display device, an aircraft-display device, portable communication devices, display devices for display or for information transfer, a medical-display device, etc.

The foregoing is illustrative of exemplary embodiments of the present invention and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device, comprising:
 a first substrate comprising a pixel region and a transparent region;
 a light emitting structure disposed on the first substrate in the pixel region;
 common lines disposed adjacent to a boundary of the pixel region and the transparent region;
 an optical member configured to prevent a light diffraction generated in an area adjacent to the common lines; and
 a second substrate disposed on the light emitting structure and the optical member.

2. The organic light emitting display device of claim 1, wherein the optical member comprises a rounded upper surface and a planar lower surface.

3. The organic light emitting display device of claim 1, wherein light rays passing through the optical member travel in a direction that is perpendicular to an upper surface of the first substrate.

4. The organic light emitting display device of claim 1, wherein a curvature of an upper surface of the optical member is determined by a distance between the adjacent common lines disposed on each side of transparent region.

5. The organic light emitting display device of claim 1, wherein the common lines comprise data lines, scan lines, and power supply lines.

6. The organic light emitting display device of claim 1, wherein the common lines comprise opaque materials.

7. The organic light emitting display device of claim 1, wherein the first substrate, the optical member, and the second substrate have a same refractive index.

8. The organic light emitting display device of claim 1, wherein the optical member comprises a Fresnel lens.

9. The organic light emitting display device of claim 1, wherein the light emitting structure comprises a semiconductor, a plurality of insulating layers, a pixel defining layer, a first electrode, a light emitting layer, and a second electrode.

10. The organic light emitting display device of claim 9, wherein the at least one of the insulating layers extends from the pixel region into the transparent region.

11. The organic light emitting display device of claim 10, wherein the optical member is disposed on the insulating layers and in the transparent region.

12. The organic light emitting display device of claim 11, wherein the common lines and the optical member are disposed at a same level.

13. The organic light emitting display device of claim 11, wherein the optical member and the insulating layers that are disposed in the transparent region have a same refractive index.

14. The organic light emitting display device of claim 1, wherein the first substrate and the optical member comprise the same materials.

15. The organic light emitting display device of claim 14, wherein the first substrate and the optical member are integrally formed.

16. The organic light emitting display device of claim 1, further comprising:
 an opening disposed in the transparent region in an area where a portion of the first substrate is removed.

17. The organic light emitting display device of claim 16, further comprising:
 a transparent member filling the opening.

18. The organic light emitting display device of claim 17, wherein the optical member is disposed on the transparent member.

19. The organic light emitting display device of claim 17, wherein the transparent member and the optical member comprise the same materials.

20. The organic light emitting display device of claim 19, wherein the transparent member and the optical member are integrally formed.

* * * * *